(12) United States Patent
Thei et al.

(10) Patent No.: US 11,063,038 B2
(45) Date of Patent: *Jul. 13, 2021

(54) THROUGH SILICON VIA DESIGN FOR STACKING INTEGRATED CIRCUITS

(71) Applicant: Taiwan Semiconductor Manufacturing Co., Ltd., Hsin-Chu (TW)

(72) Inventors: Kong-Beng Thei, Pao-Shan Village (TW); Dun-Nian Yaung, Taipei (TW); Fu-Jier Fan, Hsinchu (TW); Hsing-Chih Lin, Tainan (TW); Hsiao-Chin Tuan, Taowan (TW); Jen-Cheng Liu, Hsin-Chu (TW); Alexander Kalnitsky, San Francisco, CA (US); Yi-Sheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/829,176

(22) Filed: Mar. 25, 2020

(65) Prior Publication Data

US 2020/0243516 A1 Jul. 30, 2020

Related U.S. Application Data

(63) Continuation of application No. 15/989,556, filed on May 25, 2018, now Pat. No. 10,629,592.

(51) Int. Cl.
*H01L 23/00* (2006.01)
*H01L 27/06* (2006.01)
(Continued)

(52) U.S. Cl.
CPC ...... *H01L 27/0688* (2013.01); *H01L 21/4857* (2013.01); *H01L 23/3171* (2013.01);
(Continued)

(58) Field of Classification Search
None
See application file for complete search history.

(56) References Cited

U.S. PATENT DOCUMENTS 10,629,592 B2 * 4/2020 Thei ............... H01L 25/50
2009/0134500 A1 5/2009 Kuo
(Continued)

FOREIGN PATENT DOCUMENTS

JP 2011054637 A 3/2011

OTHER PUBLICATIONS

Non-Final Office Action dated May 30, 2019 for U.S. Appl. No. 15/989,556.
(Continued)

*Primary Examiner* — Reema Patel
(74) *Attorney, Agent, or Firm* — Eschweiler & Potashnik, LLC

(57) ABSTRACT

A three-dimensional (3D) integrated circuit (IC) is provided. In some embodiments, a first IC die comprises a first bonding structure and a first interconnect structure over a first semiconductor substrate. A second IC die is disposed over the first IC die and comprises a second bonding structure and a second interconnect structure over a second semiconductor substrate. A seal-ring structure extends from the first semiconductor substrate to the second semiconductor substrate. A plurality of through silicon via (TSV) coupling structures is arranged in the peripheral region of the 3D IC along an inner perimeter of the seal-ring structure and closer to the 3D IC than the seal-ring structure. The plurality of TSV coupling structures respectively comprises
(Continued)

a TSV disposed in the second semiconductor substrate and electrically coupling to the 3D IC through a stack of TSV wiring layers and inter-wire vias.

20 Claims, 13 Drawing Sheets

(51) Int. Cl.
    *H01L 23/48*    (2006.01)
    *H01L 23/522*   (2006.01)
    *H01L 23/31*    (2006.01)
    *H01L 21/48*    (2006.01)

(52) U.S. Cl.
    CPC ........ *H01L 23/481* (2013.01); *H01L 23/5226* (2013.01); *H01L 23/562* (2013.01); *H01L 24/03* (2013.01); *H01L 24/06* (2013.01); *H01L 24/89* (2013.01); *H01L 2224/02372* (2013.01); *H01L 2224/03916* (2013.01); *H01L 2224/80001* (2013.01)

(56) References Cited

U.S. PATENT DOCUMENTS

| | | |
|---|---|---|
| 2012/0241981 A1 | 9/2012 | Hirano |
| 2017/0186732 A1 | 6/2017 | Chu et al. |
| 2018/0269161 A1 | 9/2018 | Wu et al. |
| 2019/0131255 A1 | 5/2019 | Teng et al. |
| 2020/0035672 A1* | 1/2020 | Thei ................ H01L 23/585 |

OTHER PUBLICATIONS

Notice of Allowance dated Dec. 16, 2019 for U.S. Appl. No. 15/989,556.

* cited by examiner

US 11,063,038 B2

THROUGH SILICON VIA DESIGN FOR STACKING INTEGRATED CIRCUITS

REFERENCE TO RELATED APPLICATIONS

This Application is a Continuation of U.S. application Ser. No. 15/989,556, filed on May 25, 2018, the contents of which are hereby incorporated by reference in their entirety.

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
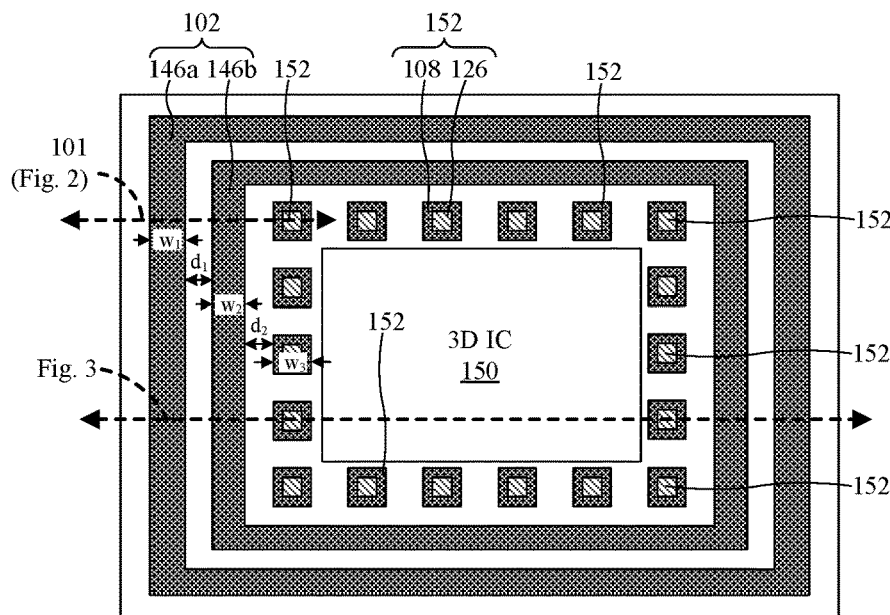
FIG. 1 illustrates a layout view of some embodiments of a three-dimensional (3D) integrated circuit (IC) with a plurality of through silicon via (TSV) coupling structures.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., a conductive wire) may be referred to as a "first" element in some embodiments, the element may be referred to as a "second" element in other embodiments.

One type of three-dimensional (3D) integrated circuit (IC) comprises a first IC die and a second IC die over the first IC die. The first and second IC dies are two-dimensional (2D) IC dies, and comprise respective semiconductor substrates, respective interconnect structures between the semiconductor substrates and respective bonding structures between the interconnect structures. The interconnect structures comprise alternating stacks of wiring layers (e.g., horizontal routing) and via layers (e.g., vertical routing). The bonding structures comprise respective bonding dielectric layers, respective redistribution layers, and respective bonding contacts. The bonding dielectric layers contact at a bonding interface between the first and second IC dies. The redistribution layers are sunken into the bonding dielectric layers and also contact at the bonding interface. The bonding contacts extend respectively from the redistribution layers to the interconnect structures.

The 3D IC further comprises a plurality of through silicon via (TSV) coupling structures comprising respective through silicon vias (TSVs) disposed through at least one substrate of the IC dies and a stack of TSV wiring layers and inter-wire vias electrically coupled to the respective TSVs. A passivation layer accommodates pad structures directly over the 3D IC to provide electrical coupling with the 3D IC respectively through the plurality of TSV coupling structures. However, the pad structures and/or the corresponding TSV coupling structures may be arranged all across a backside of the IC die according to metal wires' layout and connection needs. The TSV coupling structures cause a stress to transistor levels. Therefore, a "keep-out-zone" is established in the chip design indicating a minimum distance between the circuitry and the TSV coupling structures. A big amount of semiconductor substrate area is cleared as the "keep-out-zone" so as to accommodate a sufficient number of TSV coupling structures. This area consumption limits the chip shrinking ability and also contributes to the design and modeling complexity.

In view of the foregoing, various embodiments of the present application are directed towards a 3D IC in which a plurality of TSV coupling structures is arranged at a peripheral region of the 3D IC next to a seal-ring structure, and associated methods. For example, in some embodiments, a first IC die comprises a first semiconductor substrate, a first interconnect structure over the first semiconductor substrate, and a first bonding structure over the first interconnect structure. The first bonding structure comprises a redistribution layer and a bonding contact extending from the redistribution layer to the first interconnect structure. A second IC die is stacked and bonded to the first IC die. The second IC die comprises a second semiconductor substrate, a second bonding structure, and a second interconnect structure between the second semiconductor substrate and the second bonding structure. The second bonding structure contacts the first bonding structure at a bonding interface. A seal-ring structure is arranged in a peripheral region of the 3D IC in the first and second IC dies extending from the first semiconductor substrate to the second semiconductor substrate. A plurality of through silicon via (TSV) coupling structures is arranged in the peripheral region of the 3D IC along an inner perimeter of the seal-ring structure. The plurality of TSV coupling structures respectively comprises a through silicon via (TSV) disposed in the second semiconductor substrate and electrically coupling to the 3D IC through a stack of TSV wiring layers and inter-wire vias. Compared to a previous approach where the TSV coupling structure are disposed all across the backside of the 3D IC, by arranging the plurality of TSV coupling structure at the peripheral region of the 3D IC along an inner perimeter of the seal-ring structure, the "keep-out-zone" of the TSVs of the plurality of TSV coupling structures are reduced. Thus, the 3D IC can be further shrunk, and the design and modeling complexity can be reduced.

With reference to FIG. 1, a layout view 100 of a 3D IC 150 with a plurality of TSV coupling structures 152 is provided according to some embodiments. As illustrated, in a peripheral region 101 of the 3D IC 150, a seal-ring structure 102 laterally encloses the 3D IC 150 and extends laterally along the peripheral region 101 of the 3D IC 150. In some embodiments, the seal-ring structure 102 may comprise one or more conductive rings that receptively has a laterally continuous ring shape, for example, a first conductive ring 146a and a second conductive ring 146b separated from one another by a dielectric material.

A plurality of through silicon via (TSV) coupling structures 152 is arranged in the peripheral region 101 of the 3D IC along an inner perimeter of the seal-ring structure 102. The plurality of TSV coupling structures 152 are separated from the seal-ring structure 102 and separated from one another by the dielectric material, and respectively comprises a through silicon via (TSV) 126 electrically coupling to the 3D IC 150 through an interconnect structure 108.

In some embodiments, the first conductive ring 146a may have a first lateral width w1 equal to a second lateral width w2 of the second conductive ring 146b. The TSV coupling structure 152 may have a third lateral width w3 greater than the first lateral width w1 or the second lateral width w2. A first distance d1 between the first and second conductive rings 146a, 146b may be smaller than a second distance d2 between the second conductive ring 146b and the TSV coupling structure 152.

Figure 2:
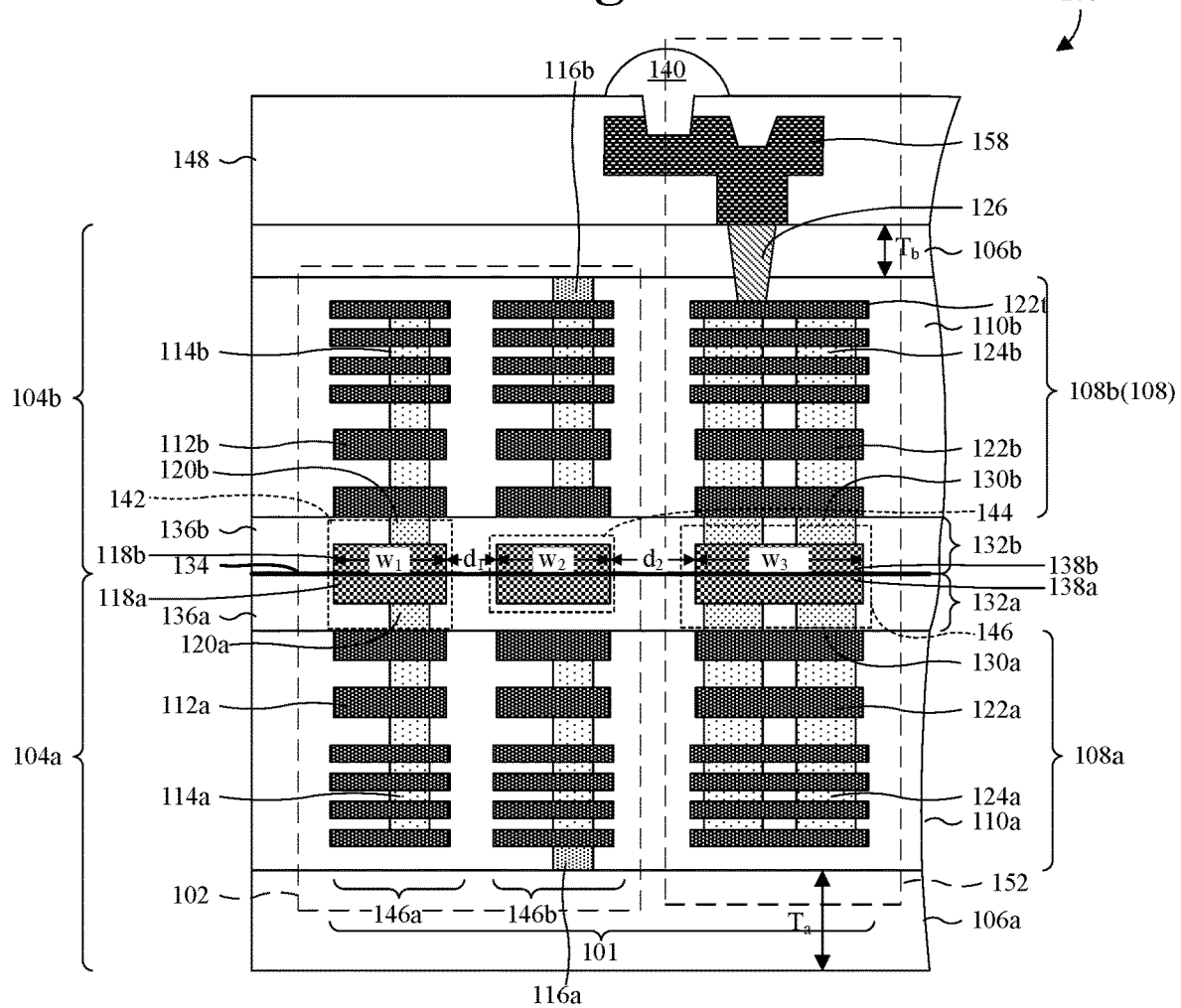
FIG. 2 illustrates a cross-sectional view of some embodiments of the 3D IC of FIG. 1.

With reference to FIG. 2, a cross-sectional view 200 of some embodiments of the peripheral region 101 of the 3D IC 150 of FIG. 1 is provided. As illustrated, a second IC die 104b is disposed over a first IC die 104a. The first and second IC dies 104a, 104b may comprise respective semiconductor substrates 106a, 106b. The semiconductor substrates 106a, 106b are spaced from one another, respectively under and over respective interconnect structures 108a, 108b. In some embodiments, the semiconductor substrates 106a, 106b are bulk substrates of monocrystalline silicon or some other semiconductor, some other type of semiconductor substrate, or a combination of the foregoing. Further, in some embodiments, the semiconductor substrates 106a, 106b have respective thicknesses that are different. For example, a first semiconductor substrate 106a of the first IC die 104a may have a first thickness $T_a$ and a second semiconductor substrate 106b of the second IC die 104b may have a second thickness $T_b$ smaller than the first thickness.

The respective interconnect structures 108a, 108b of the first and second IC dies 104a, 104b are between the semiconductor substrates 106a, 106b and are spaced from one another by bonding structures 132a, 132b (e.g. hybrid bonding layers). A first interconnect structure 108a of the first IC die 104a comprises a first interlayer dielectric (ILD) layer 110a, first wiring layers 112a, first inter-wire via layers 114a, first TSV wiring layers 122a, and first TSV inter-wire vias 124a. Similarly, a second interconnect structure 108b of the second IC die 104b comprises a second ILD layer 110b, second wiring layers 112b, second inter-wire via layers 114b, second TSV wiring layers 122b, and second TSV inter-wire vias 124b. The first and second ILD layers 110a, 110b may be, for example, silicon dioxide, a low κ dielectric, some other dielectric, or a combination of the foregoing. As used here, a low κ dielectric is a dielectric with a dielectric constant κ less than about 3.9. The first wiring layers 112a are alternatingly stacked with the first inter-wire vias 114a in the first ILD layer 110a. The second wiring layers 112b are alternatingly stacked with the second inter-wire vias 114b in the second ILD layer 110b.

The seal-ring structure 102 is arranged in the first and second IC dies 104a, 104b. The seal-ring structure 102 laterally encloses the 3D IC 150 (shown in FIG. 1) of the first and second IC dies 104a, 104b, and extends respectively from the first semiconductor substrate 106a to the second semiconductor substrate 106b, such that the seal-ring structure 102 defines a wall or barrier protecting the 3D IC 150. In various embodiments, the seal-ring structure 102 is made up of one or more conductive rings that are concentrically aligned. For example, the seal-ring structure 102 may comprise the first conductive ring 146a and a second conductive ring 146b. The seal-ring structure 102 may protect the 3D IC from a die saw singulating the first and second IC dies 104a, 104b and/or from gases diffusing into the first and second IC dies 104a, 104b from an ambient environment of the first and second IC dies 104a, 104b.

In some embodiments, the first conductive ring 146a of the seal-ring structure 102 comprises a first stack of the wiring layers 112a, 112b and the inter-wire vias 114a, 114b disposed at an outmost region of the peripheral region 101 and connected by a first pair 142 of bonding structures. The first pair 142 of bonding structures may include components of the redistribution layers 118a, 118b and bonding contacts 120a, 120b. The first conductive ring 146a may be electrically isolated from the semiconductor substrates 106a, 106b and spaced apart from the semiconductor substrates 106a, 106b by the first and second ILD layers 110a, 110b. The second conductive ring 146b of the seal-ring structure 102 comprises a second stack of the wiring layers 112a, 112b and the inter-wire vias 114a, 114b, and connected to a first device contact 116a that borders the first semiconductor substrate 106a and a second device contact 116b that borders the second semiconductor substrate 106b. The second conductive ring 146b may comprise a second pair 144 of bonding structures which may include components of the redistribution layers 118a, 118b, but omit bonding contacts. The second stack of the wiring layers 112a and the inter-wire vias 114a may be electrically isolated from the wiring layers 112b and the inter-wire vias 114b by the bonding dielectric layers 136a, 136b. Since at least one of the conductive rings 146a, 146b is defined with a pair of bonding structures 132a, 132b, the seal-ring structure 102 may define a continuous wall or barrier respectively from and to the semiconductor substrates 106a, 106b for robust reliability and performance.

The TSV coupling structure 152 is disposed at an inner side of the second conductive ring 146b opposite to the first conductive ring 146a. The TSV coupling structure 152 comprises a stack of TSV wiring layers 122a, 122b (e.g. horizontal routing) and TSV inter-wire vias 124a, 124b (e.g. vertical routing) connected by pairs of TSV redistribution layers 128a, 128b and TSV bonding contacts 130a, 130b. The TSV coupling structure 152 also comprises a TSV 126 touching a metal layer 122t of the second interconnect structure 108b and disposed through the second semiconductor substrate 106b. The metal layer 122t may be one of the horizontal metal lines of the interconnect structure 108b that is closest to the second semiconductor substrate 106b. The TSV 126 may be further connected to a pad structure 158 in a passivation layer 148 and a solder bump 140 (or other applicable structures) overlying the passivation layer 148 to provide electrical connections and bonding, contacting, or connecting structures. The pad structure 158 may facilitate electrical coupling between the 3D IC 150 and external devices or power source. The passivation layer 148 may be, for example, silicon dioxide, silicon nitride, silicon oxynitride, silicon carbide, some other dielectric, or a combination of the foregoing. Compared to a previous approach where the TSV coupling structure is arranged "randomly" all across the backside of the 3D IC according to interconnect structures' layout (e.g. according to the layout of the metal layer 122t of the second interconnect structure 108b), by re-routing and arranging some or all of the TSV coupling structures at the peripheral region of the 3D IC along an inner perimeter of the seal-ring structure, the "keep-out-zone" of the TSVs of the plurality of TSV coupling structures are reduced. Thus, the 3D IC can be further shrunk, and the design and modeling complexity can be reduced.

The first and second wiring layers 112a, 112b, the first and second inter-wire vias 114a, 114b, the first and second device contacts 116a, 116b, the TSV wiring layers 122a, 122b, the TSV inter-wire vias 124a, 124b, the TSV redistribution layers 128a, 128b, and TSV bonding contacts 130a, 130b are conductive and may be, for example, aluminum copper, copper, aluminum, tungsten, some other metal or conductive material, or a combination of the foregoing. In some embodiments, the first wiring layers 112a are integrated respectively with, and/or the same materials respectively as, immediately underlying layers of the first inter-wire via and device contacts 114a, 116a. In other embodiments, the first wiring layers 112a are distinct respectively from, and/or different materials respectively than, immediately underlying layers of the first inter-wire via and device contacts 114a, 116a. Similarly, in some embodiments, the second wiring layers 112b are integrated respectively with, and/or the same materials respectively as, immediately overlying layers of the second inter-wire via and device contacts 114b, 116b. In other embodiments, the second wiring layers 112b are respectively distinct from, and/or different materials respectively than, immediately overlying layers of the second inter-wire via and device contacts 114b, 116b.

The respective bonding structures 132a, 132b of the first and second IC dies 104a, 104b are between the interconnect structures 108a, 108b and contact at a bonding interface 134. The bonding structures 132a, 132b comprise respective bonding dielectric layer 136a, 136b, respective redistribution layers 118a, 118b, and respective bonding contacts 120a, 120b, TSV bonding contacts 130a, 130b. The bonding dielectric layers 136a, 136b contact at the bonding interface 134 to define a dielectric-to-dielectric interface. Further, the bonding dielectric layers 136a, 136b may be, for example, silicon dioxide, some other dielectric, or a combination of the foregoing.

The redistribution layers 118a, 118b and TSV redistribution layers 138a, 138b are recessed respectively into the bonding dielectric layers 136a, 136b, such that redistribution layers 118a, 118b and TSV redistribution layers 138a, 138b are respectively even with the bonding dielectric layers 136 at the bonding interface 134. Further, the redistribution layers 118a, 118b and TSV redistribution layers 138a, 138b contact at the bonding interface 134 to define a conductor-to-conductor interface, and are electrically coupled to the interconnect structures 108a, 108b, respectively, by the bonding contacts 120a, 120b and TSV bonding contacts 130a, 130b. The bonding contacts 120a, 120b and TSV bonding contacts 130a, 130b extend respectively from the redistribution layers 118a, 118b and TSV redistribution layers 138a, 138b respectively to the interconnect structures 108a, 108b. The redistribution layers 118a, 118b, TSV redistribution layers 138a, 138b, bonding contacts 120a, 120b and TSV bonding contacts 130a, 130b are conductive and may be, for example, aluminum copper, copper, aluminum, tungsten, some other conductive material, or a combination of the foregoing.

In some embodiments, a first redistribution layer 118a of the first IC die 104a is integrated with, and/or the same material as, a first bonding contact 120a of the first IC die 104a. In other embodiments, the first redistribution layer 118a is distinct from, and/or a different material than, the first bonding contact 120a. Similarly, in some embodiments, a second redistribution layer 118b of the second IC die 104b is integrated with, and/or the same material as, a second bonding contact 120b of the second IC die 104b. In other embodiments, the second redistribution layer 118b is distinct from, and/or a different material than, the second bonding contact 120b.

The seal-ring structure 102 is arranged in the first and second IC dies 104a, 104b. The seal-ring structure 102 laterally encloses the 3D IC 150 (shown in FIG. 1) of the first and second IC dies 104a, 104b, and extends respectively from the first semiconductor substrate 106a to the second semiconductor substrate 106b, such that the seal-ring structure 102 defines a wall or barrier protecting the 3D IC. For example, the seal-ring structure 102 may protect the 3D IC from a die saw singulating the first and second IC dies 104a, 104b and/or from gases diffusing into the first and second IC dies 104a, 104b from an ambient environment of the first and second IC dies 104a, 104b. Further, the seal-ring structure 102 is made up of one or more conductive rings that are concentrically aligned. For example, the seal-ring structure 102 may comprise the first conductive ring 146a and a second conductive ring 146b.

Figure 3:
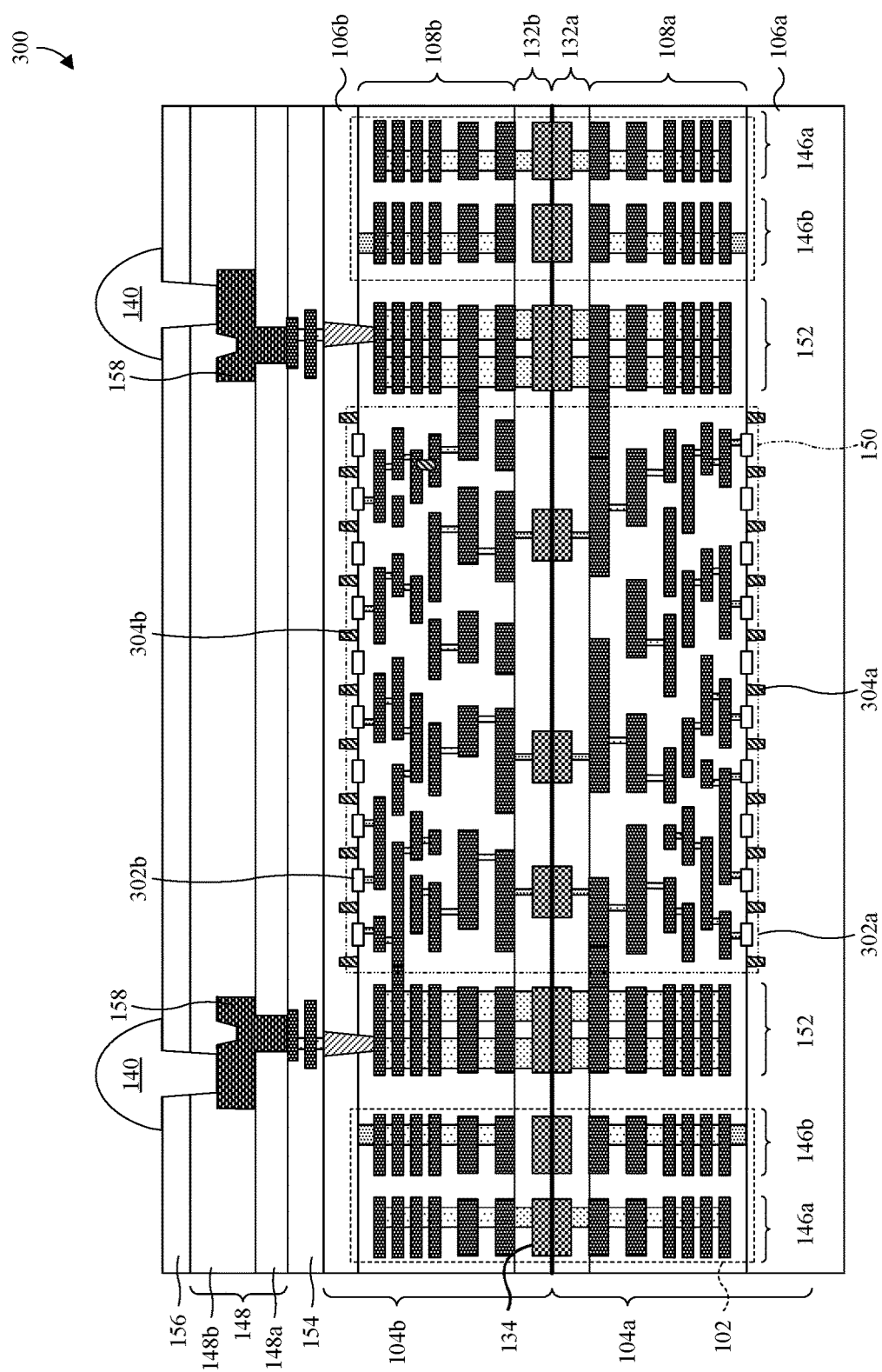
FIG. 3 illustrates a cross-sectional view of some more detailed embodiments of the 3D IC of FIG. 1 in which a 3D IC is encompassed by the plurality of TSV coupling structures.

With reference to FIG. 3, a cross-sectional view 300 the 3D IC of FIG. 1 is provided in which the 3D IC 150 is shown encompassed by the plurality of TSV coupling structures 152 according to some embodiments. These embodiments may, for example, also be combined with the embodiments of FIGS. 1-2 and/or FIGS. 4-5 below, or a combination of the foregoing.

As illustrated, the first and second IC dies 104a, 104b are 2D IC dies and may comprise semiconductor device following different fabrication nodes and configured to operate at different voltage levels. For example, the first die 104a may be a 28 nm die and operate at a relative low voltage level (e.g. 1V), while the second die 104b may be a 55 nm die and operate at a relative high voltage level (greater than that of the first die 104a, e.g. 1.1V, 6V, or 32V). the 3D IC 150 comprises one or more semiconductor devices 302a, 302b distributed between the semiconductor substrates 106a, 106b, and electrically coupled to one another with conductive paths defined by the interconnect structures 108a, 108b and the bonding structures 132a, 132b. The semiconductor devices 302a, 302b may be, for example, MOSFETs, IGFETS, MIM capacitors, flash memory cells, or the like. Further, in some embodiments, isolation regions 304a, 304b are arranged in the semiconductor substrates 106a, 106b to provide electrical isolation between the semiconductor devices 302a, 302b. The isolation regions 304a, 304b may be, for example, shallow trench isolation (STI) regions or deep trench isolation (DTI) regions.

Figure 4:
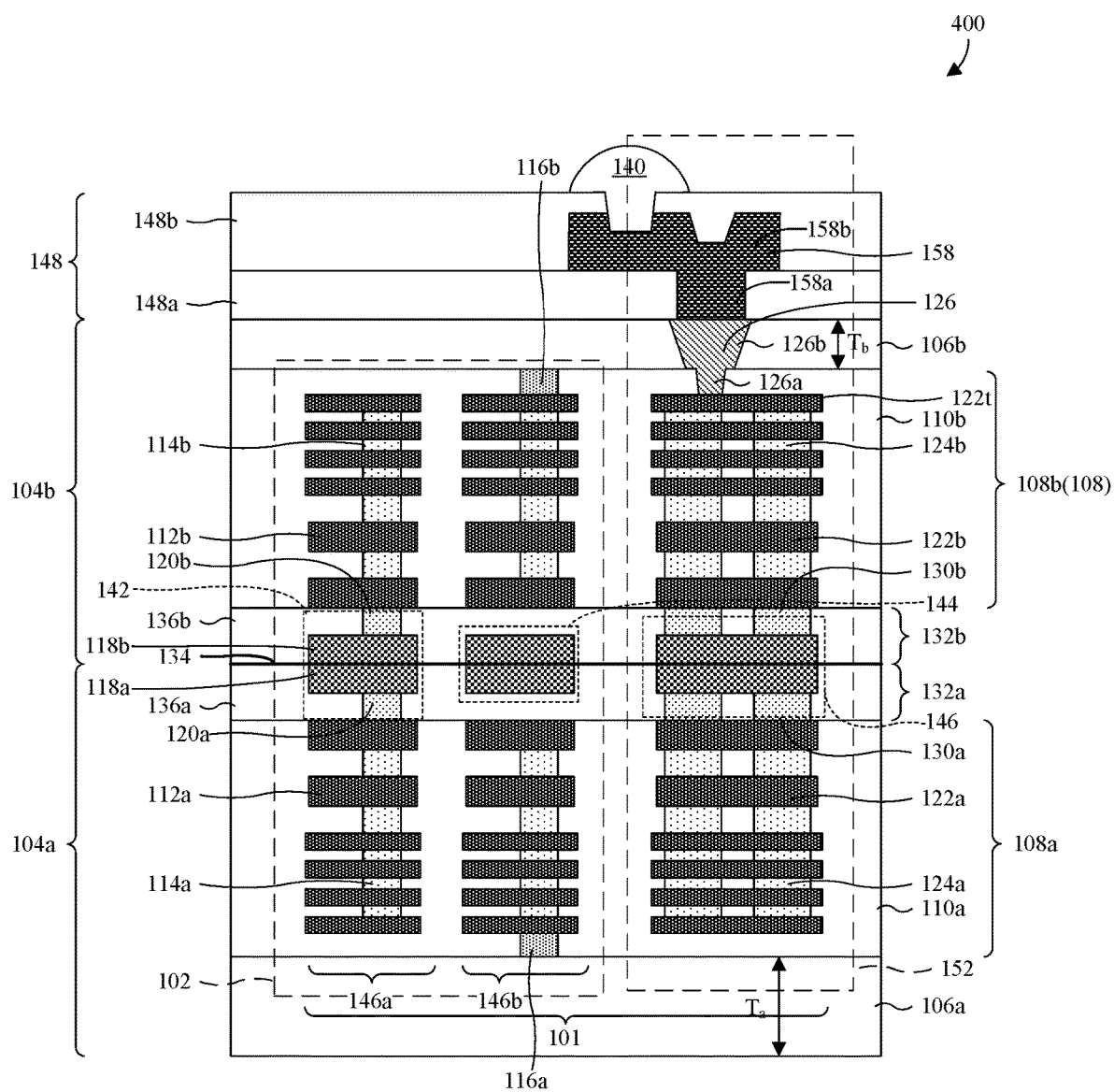
FIGS. 4-5 illustrate cross-sectional views of other embodiments of the 3D IC of FIG. 1 in which a plurality of pad structures is arranged in the plurality of TSV coupling structures.

With reference to FIG. 4, a cross-sectional view 400 of other embodiments of the peripheral region 101 of a 3D IC is provided, in which the TSVs 126 over the TSV coupling structure 152 have alternative shapes. These embodiments may, for example, also be combined with the embodiments of FIGS. 1-2 and/or the embodiments of FIG. 3.

As illustrated by the cross-sectional view 400 of FIG. 4, the passivation layer 148 comprises a first passivation sub-layer 148a and a second passivation sub-layer 148b overlying the first passivation sub-layer 148a and further comprises a pad structure 158 in the first and second passivation sub-layers 148a, 148b. The first and second passivation sub-layers 148a, 148b are dielectric and may be, for example, silicon dioxide, silicon nitride, silicon oxynitride, silicon carbide, some other dielectric, or a combination of the foregoing. Further, the first and second passivation sub-layers 148a, 148b may be the same material or different materials.

The pad structure 158 is disposed directly overlying the TSV coupling structure 152. For example, the pad structure 158 may comprise a first pad structure 158a as a via region and a second pad structure 158b as a pad region directly on the first pad structure 158a The pad structure 158a is conductive and may be, for example, copper, aluminum, aluminum copper, tungsten, some other conductor, or a combination of the foregoing. In some embodiments, the second pad structure 158b is/are integrated with, and/or the same material as, the first pad structure 158a. In other embodiments, the second pad structure 158b is/are distinct from, and/or a different material than, the first pad structure 158a. Further, in some embodiments, each of the second pad structure 158b has a third width greater than that of each of the first pad structure 158a.

Also illustrated by the cross-sectional view 400 of FIG. 4, a variant of FIG. 2 is provided in which the TSV 126 discretely tapers, such that sidewalls of the TSV 126 are discontinuous from the first pad structure 158a to the metal layer 122t. The TSV 126 comprises a backside substrate portion 126b in the second semiconductor substrate 106b and extending from a top surface of the second semiconductor substrate 106b, through the second semiconductor substrate 106b, to a bottom surface of the second semiconductor substrate 106b. Further, the TSV 126 comprises a backside contact portion 126a in the second ILD layer 110b and extending from the bottom surface of the second semiconductor substrate 106b to a TSV wiring layer 122t nearest the second semiconductor substrate 106b.

The TSV 126 is conductive and may be, for example, copper, aluminum, aluminum copper, tungsten, some other conductor, or a combination of the foregoing. In some embodiments, the backside substrate portion 126b is integrated with, and/or the same material as, the backside contact portion 126a. In other embodiments, the backside substrate portion 126b is distinct from, and/or a different material than, the backside contact portion 126a. Further, the backside substrate portion 126b has a lateral width greater than that of the backside contact portion 126a.

Figure 5:
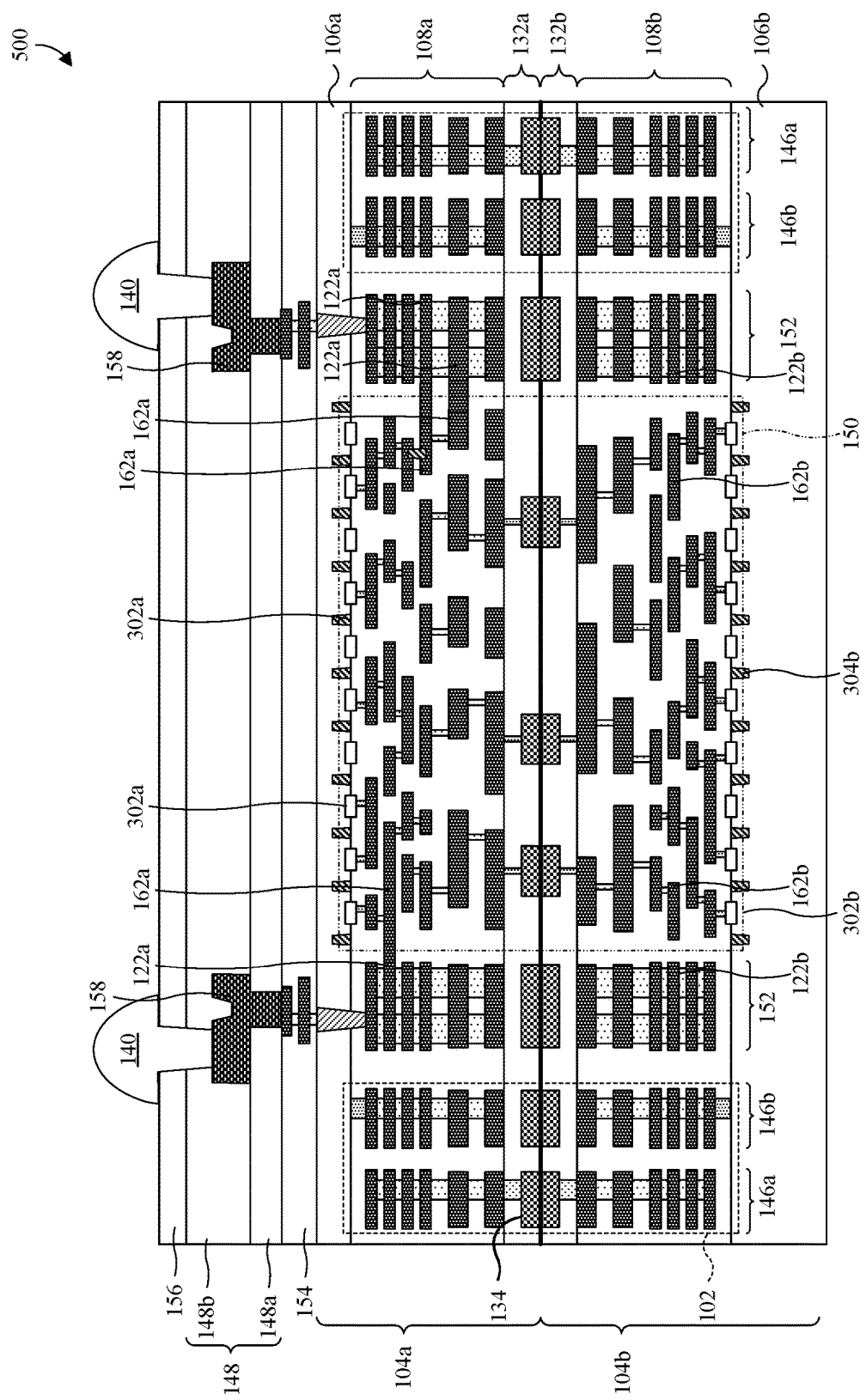

With reference to FIG. 5, a cross-sectional view 500 of other embodiments of the 3D IC is provided in which the coupling structures 152 may be disposed through the first semiconductor substrate 106a, electrically connected to the first wiring layers 162a of the first die, and electrically disconnected to the second wiring layers 162b of the second die 104b. These embodiments may, for example, also be combined with the embodiments of FIGS. 1-2 and/or the embodiments of FIG. 4. As illustrated by the cross-sectional view 500 of FIG. 5, as an example, one or multiple of the first TSV wiring layers 122a may be electrically connected to corresponding first wiring layers 162a. One or multiple of the second TSV wiring layers 122b may be electrically isolated to the first TSV wiring layers 122a and/or the second wiring layers 162b. TSV bonding contacts may not present in the coupling structure 152.

Figure 14:
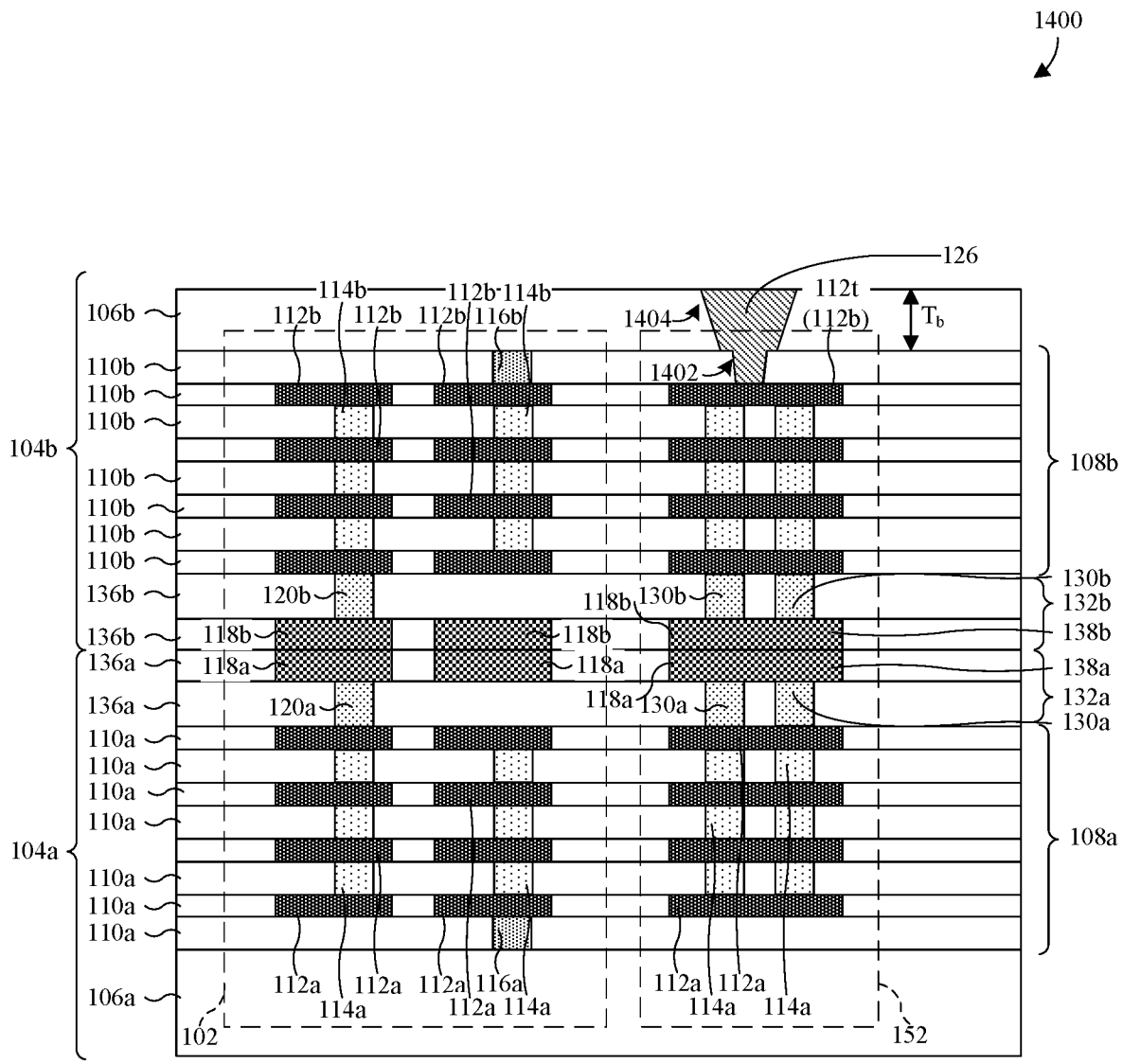
Figure 15:
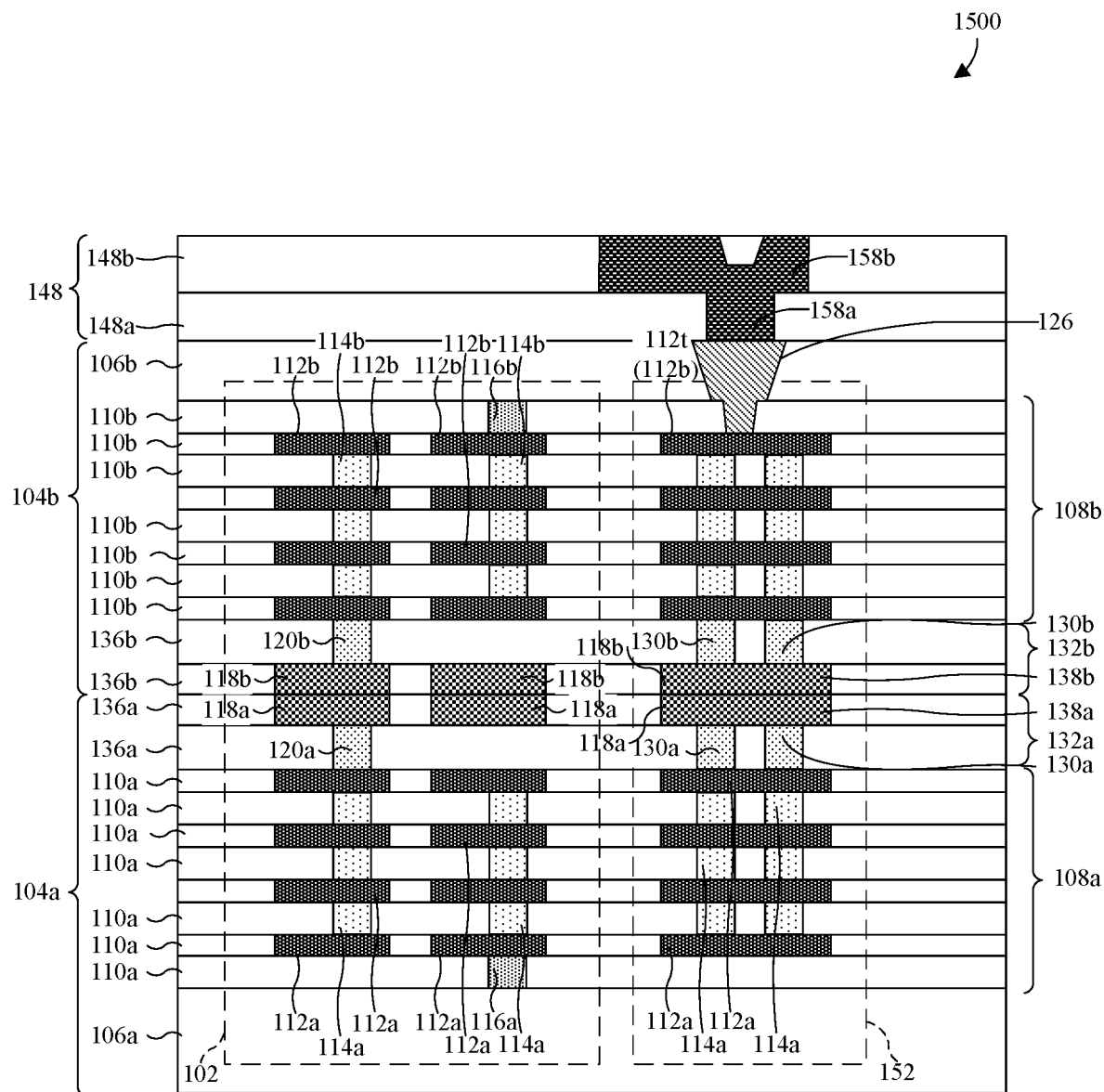
Figure 16:
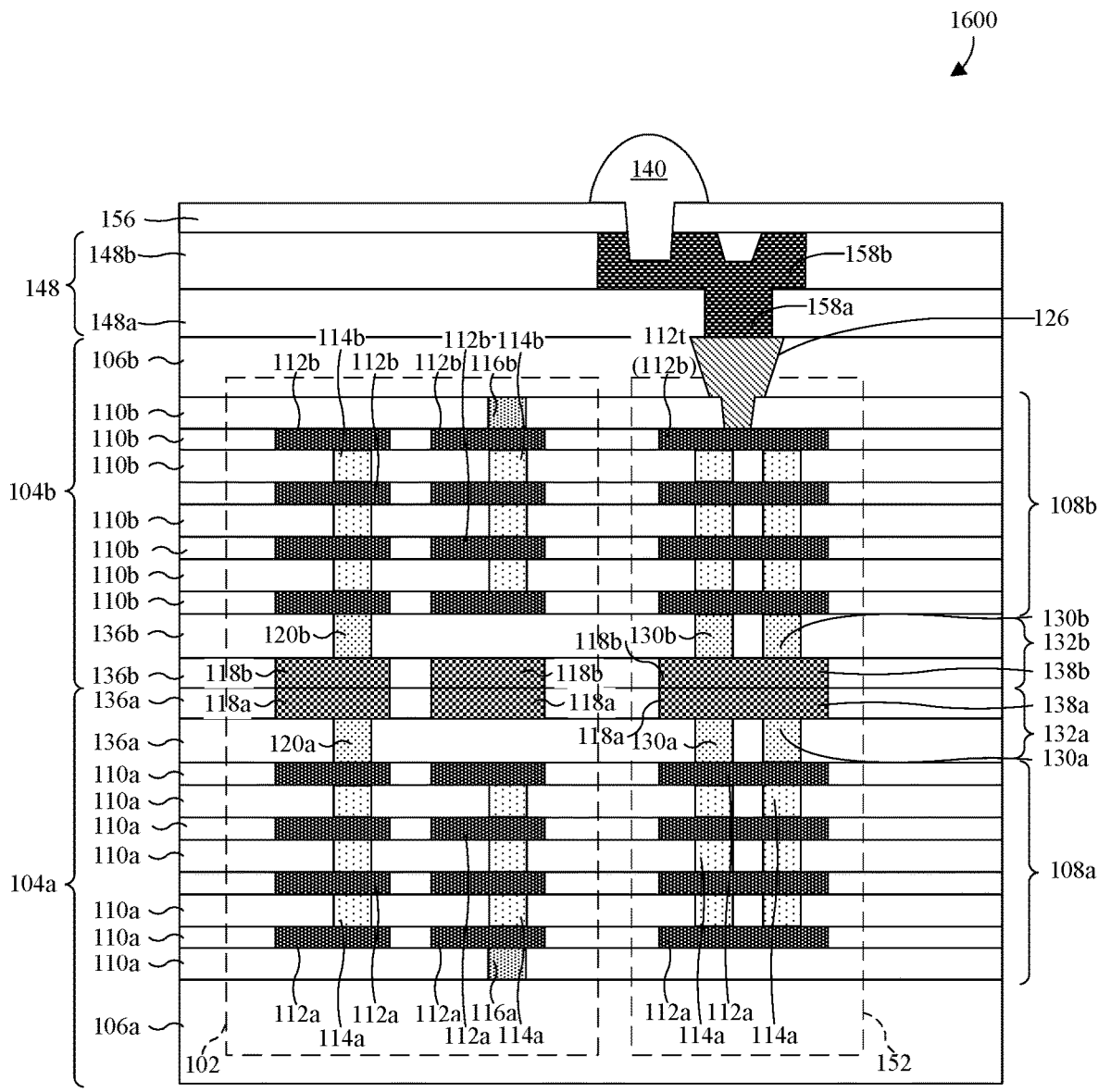

With reference to FIGS. 6-16, a series of cross-sectional views 600-1600 illustrate some embodiments of a method for manufacturing a 3D IC with a seal-ring structure and a plurality of TSV coupling structures (see, e.g., FIG. 16). The 3D IC comprises a first IC die 104a and a second ID die 104b (see, e.g., FIG. 11) arranged over and hybrid bonded to the first IC die 104a. Further, the seal-ring structure 102 is made up of a first seal-ring substructure 102a (see e.g., FIG. 7) in the first IC die 104a and a second seal-ring substructure 102b (see, e.g., FIG. 11) in the second IC die 104b. The plurality of TSV coupling structures 152 (see, e.g., FIG. 12) is respectively made up of a lower TSV coupling structures 152a (see e.g., FIG. 7) in the first IC die 104a and an upper TSV coupling structures 152b (see, e.g., FIG. 11) in the second IC die 104b.

Figure 6:
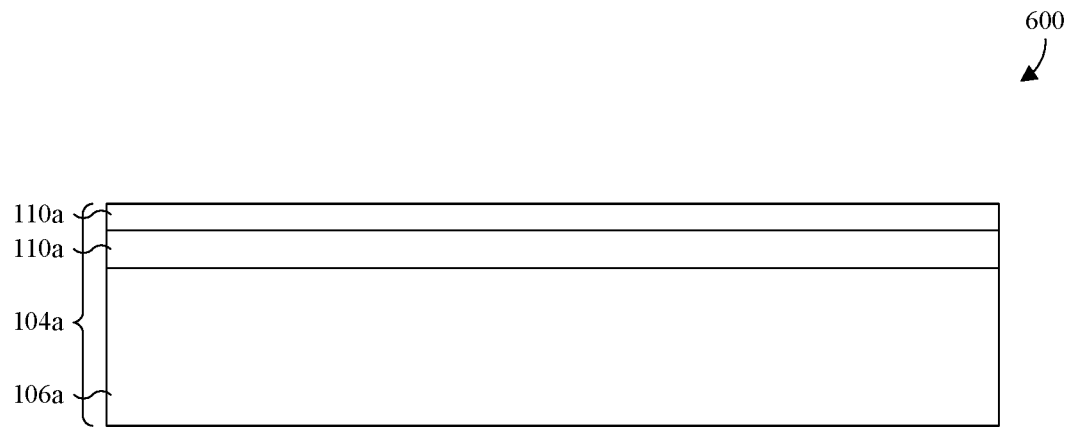
FIGS. 6-16 illustrate a series of cross-sectional views of some embodiments of a method for manufacturing a 3D IC with a plurality of TSV coupling structures.

As illustrated by the cross-sectional view 600 of FIG. 6, a pair of first ILD layers 110a is formed over a first semiconductor substrate 106a. For example, a lower layer of the first ILD layers 110a is formed covering the first semiconductor substrate 106a, and an upper layer of the first ILD layers 110a is subsequently formed covering the lower layer. The first ILD layers 110a are formed stacked and may, for example, be formed by vapor deposition (e.g., chemical or physical vapor deposition), atomic layer deposition, thermal oxidation, some other growth or deposition process, or a combination of the foregoing. Further, the first ILD layers 110a may be formed of, for example, silicon dioxide, a low κ dielectric, some other dielectric, or the like.

In some embodiments, an etch stop layer (not shown) is formed between the lower and upper first ILD layers 110a. The etch stop layer is a different material than the lower and upper first ILD layers 110a and may be, for example, silicon nitride. Further, in some embodiments, the lower and upper first ILD layers 110a are integrated together and/or are the same material. For example, the lower and upper first ILD layers 110a may be different regions of the same deposition or growth.

Figure 7:
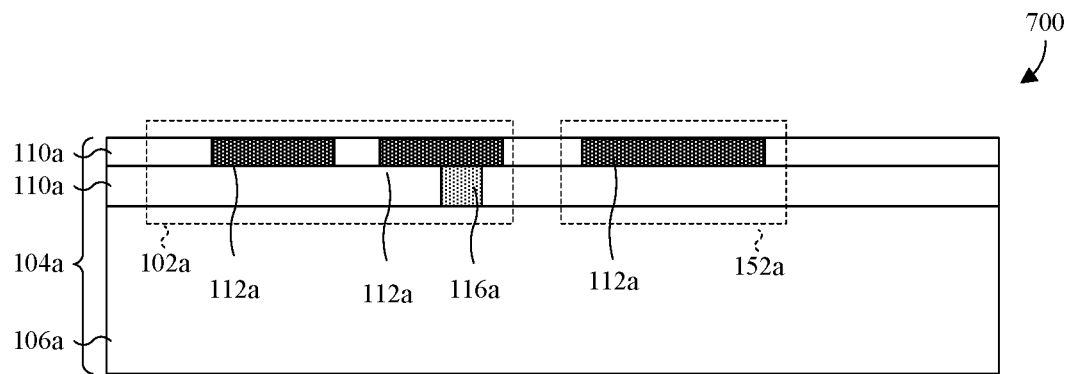

As illustrated by the cross-sectional view 700 of FIG. 7, a first wiring layer 112a and a first device contact 116a are formed respectively in the first ILD layers 110a. For example, the first wiring layer 112a may be formed sunken into the upper layer of the first ILD layers 110a, and the first device contact 116a may be formed extending from the first wiring layer 112a, through the lower layer of the first ILD layers 110a, to the first semiconductor substrate 106a. Further, the first wiring layer 112a and the first device contact 116a are formed with patterns of the first seal-ring substructure 102a and the 4 lower TSV coupling structures 152a.

In some embodiments, the process for forming the first wiring layer 112a and the first device contact 116a comprises performing a first selective etch into the upper layer of the first ILD layers 110a to form first openings in the upper layer with a pattern of the first wiring layer 112a. The first selective etch may stop, for example, on an etch stop layer between the first ILD layers 110a. Thereafter, a second selective etch is performed into the lower layer of the first ILD layers 110a to form second openings in the lower layer with a pattern of the first device contact 116a. A conductive layer is formed filling the first and second openings, and a planarization is performed to coplanarize an upper or top surface of the conductive layer with an upper or top surface of the upper layer, whereby the first wiring layer 112a and the first device contact 116a are formed from the conductive layer. The first and second selective etches may be performed selectively by, for example, photolithography, and/or the planarization may be performed by, for example, chemical mechanical polish (CMP).

While the acts of FIGS. 6 and 7 illustrate and describe a dual-damascene-like process for forming the first wiring layer 112a and the first device contact 116a, a single-damascene-like process may alternatively be employed to form the first wiring layer 112a and the first device contact 116a in other embodiments. A dual-damascene-like process and a single-damascene-like process are respectively dual-damascene and single-damascene processes that are not restricted to copper.

Figure 8:
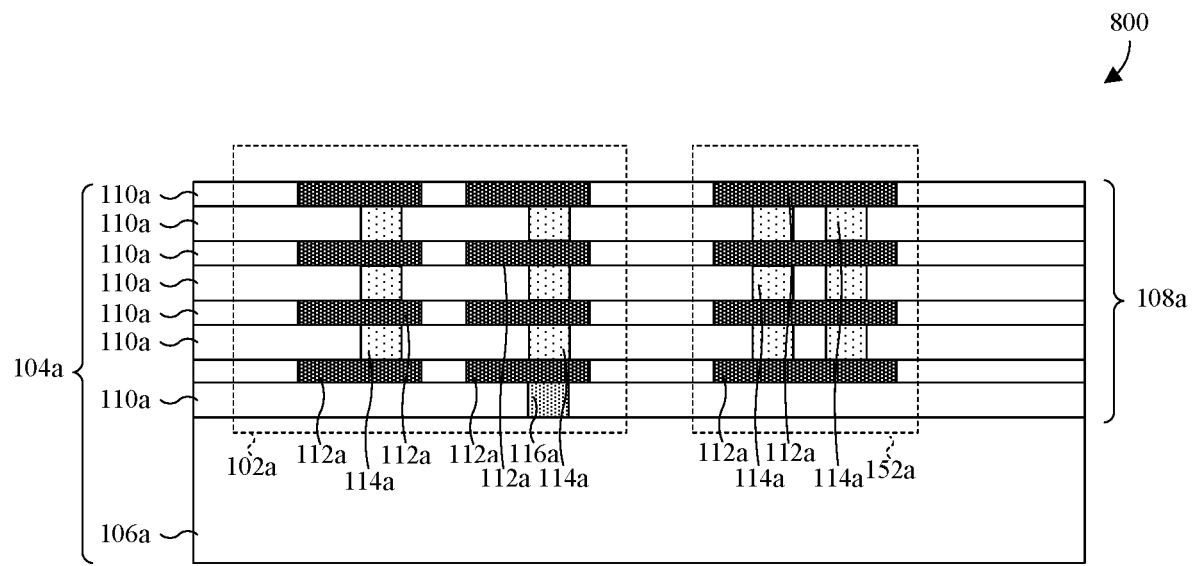

As illustrated by the cross-sectional view 800 of FIG. 8, the acts of FIGS. 6 and 7 are repeated one or more times. As such, one or more additional first ILD layers 110a are formed stacked over the first semiconductor substrate 106a, each accommodating an additional first wiring layer 112a and a first inter-wire via layer 114a. Collectively, the first ILD layers 110a, the first wiring layers 112a, the first device contact 116a, and the one or more first inter-wire via layers 114a define a first interconnect structure 108a.

Figure 9:
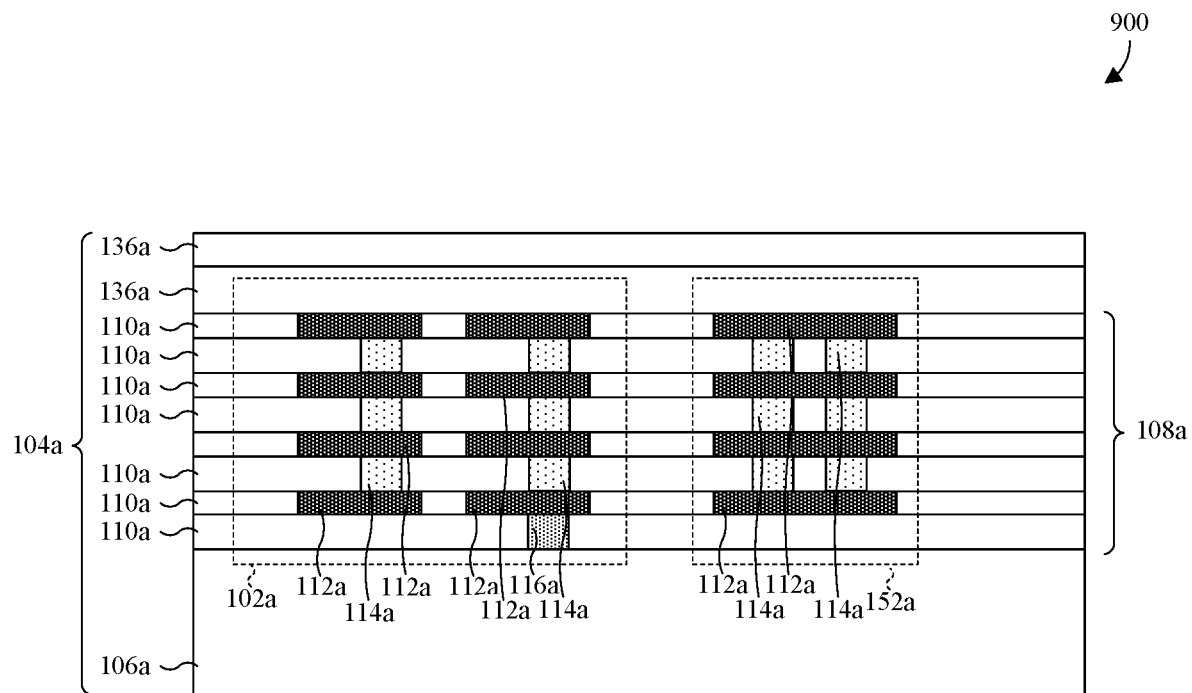

As illustrated by the cross-sectional view 900 of FIG. 9, a pair of first bonding dielectric layers 136a is formed over the first interconnect structure 108a. For example, a lower layer of the first bonding dielectric layers 136a is formed covering the first interconnect structure 108a, and an upper layer of the first bonding dielectric layers 136a is subsequently formed covering the lower layer. The first bonding dielectric layers 136a may be formed, for example, in the same manner, or a similar manner as described for the first ILD layers 110a in FIG. 6.

In some embodiments, an etch stop layer (not shown) is formed between the first bonding dielectric layers 136a. The etch stop layer is a different material than the first bonding dielectric layers 136a and may be, for example, silicon nitride. Further, in some embodiments, the first bonding dielectric layers 136a are integrated together and/or are the same material. For example, the first bonding dielectric layers 136a may be different regions of the same deposition or growth.

Figure 10:
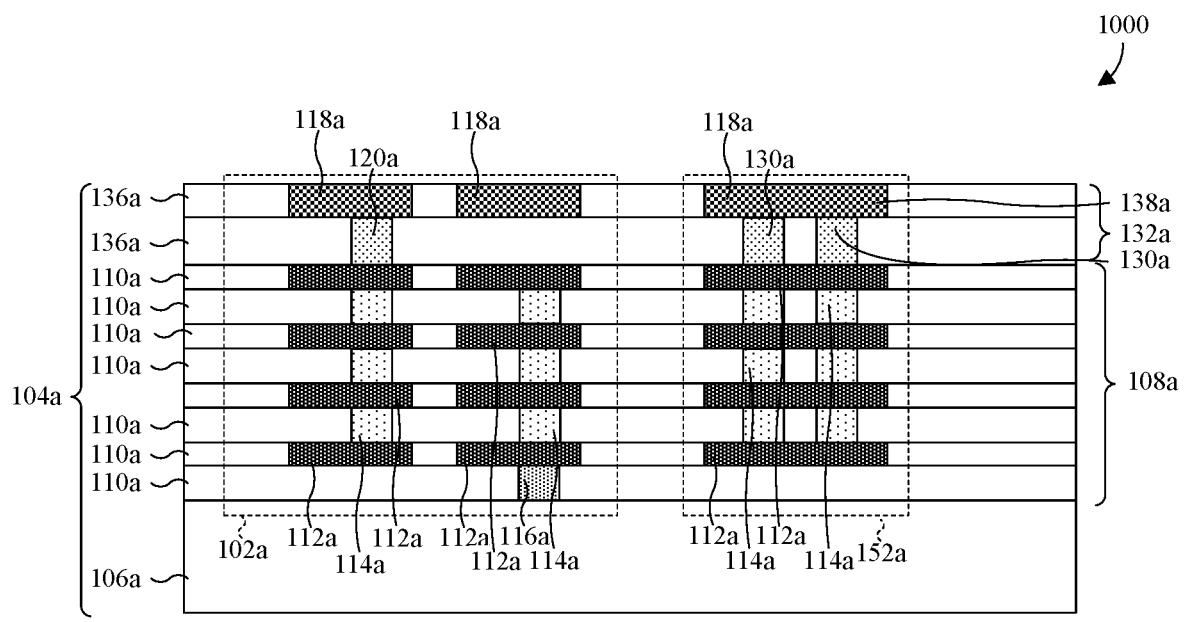

As illustrated by the cross-sectional view 1000 of FIG. 10, a first redistribution layer 118a and first bonding contact 120a, the first TSV bonding contact 130a are formed in the first bonding dielectric layers 136a respectively for the lower seal-ring structure 102a and the lower TSV coupling structures 152a. For example, the first redistribution layer 118a may be formed sunken into an upper layer of the first bonding dielectric layers 136a, and the first bonding contact 120a may be formed extending from the first redistribution layer 118a, through the lower layer of the first bonding dielectric layers 136a, to the first interconnect structure 108a. The first redistribution layer 118a and the first bonding contact 120a are formed with a pattern of the first seal-ring substructure 102a. The first redistribution layer 118a and the first bonding contacts 130a are formed with a pattern of the lower TSV coupling structures 152a. Collectively, the first bonding dielectric layers 136a, the first redistribution layer 118a, and the first bonding contact 120a, the first TSV contact 130a define a first bonding structure 132a.

In some embodiments, the process for forming the first redistribution layer 118a and the first bonding contacts 120a and TSV bonding contacts 130a is performed in the same manner or a similar manner as described for the first wiring layer 112a and the first device contact 116a in FIG. 7. Further, while the acts of FIGS. 9 and 10 illustrate and describe a dual-damascene-like process for forming the first redistribution layer 118a and the first bonding contacts 120a and TSV bonding contacts 130a, a single-damascene-like process may alternatively be employed to form the first redistribution layer 118a and the first bonding contacts 120a and TSV bonding contacts 130a in other embodiments.

Figure 11:
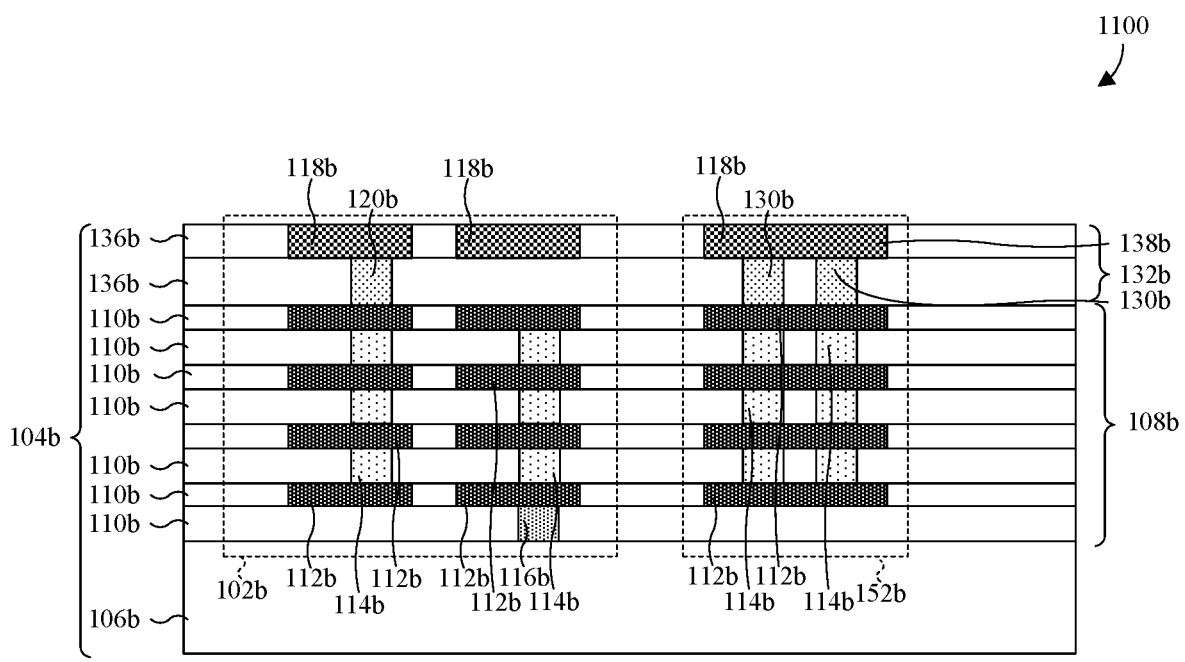

As illustrated by the cross-sectional view 1100 of FIG. 11, the second IC die 104b is formed with the second seal-ring substructure 102b and the upper TSV coupling structures 152b. The second IC die 104b is formed in the same manner or a similar manner as described for the first IC die 104a in FIGS. 6-10. As such, the second IC die 104b comprises a second interconnect structure 108b over a second semiconductor substrate 106b, and further comprises a second bonding structure 132b over the second interconnect structure 108b. The second interconnect structure 108b comprises a pair of second ILD layers 110b, as well as a second wiring layer 112b and a second device contact 116b respectively in the second ILD layers 110b. Further, the second interconnect structure 108b comprises one or more additional pairs of second ILD layers 110b stacked over the second semiconductor substrate 106b, each accommodating additional second wiring layer 112b and second inter-wire via layers 114b. The second bonding structure 132b comprises a pair of second bonding dielectric layers 136b, as well as a second redistribution layer 118b and a second bonding contact 120b respectively in the second bonding dielectric layers 136b.

Figure 12:
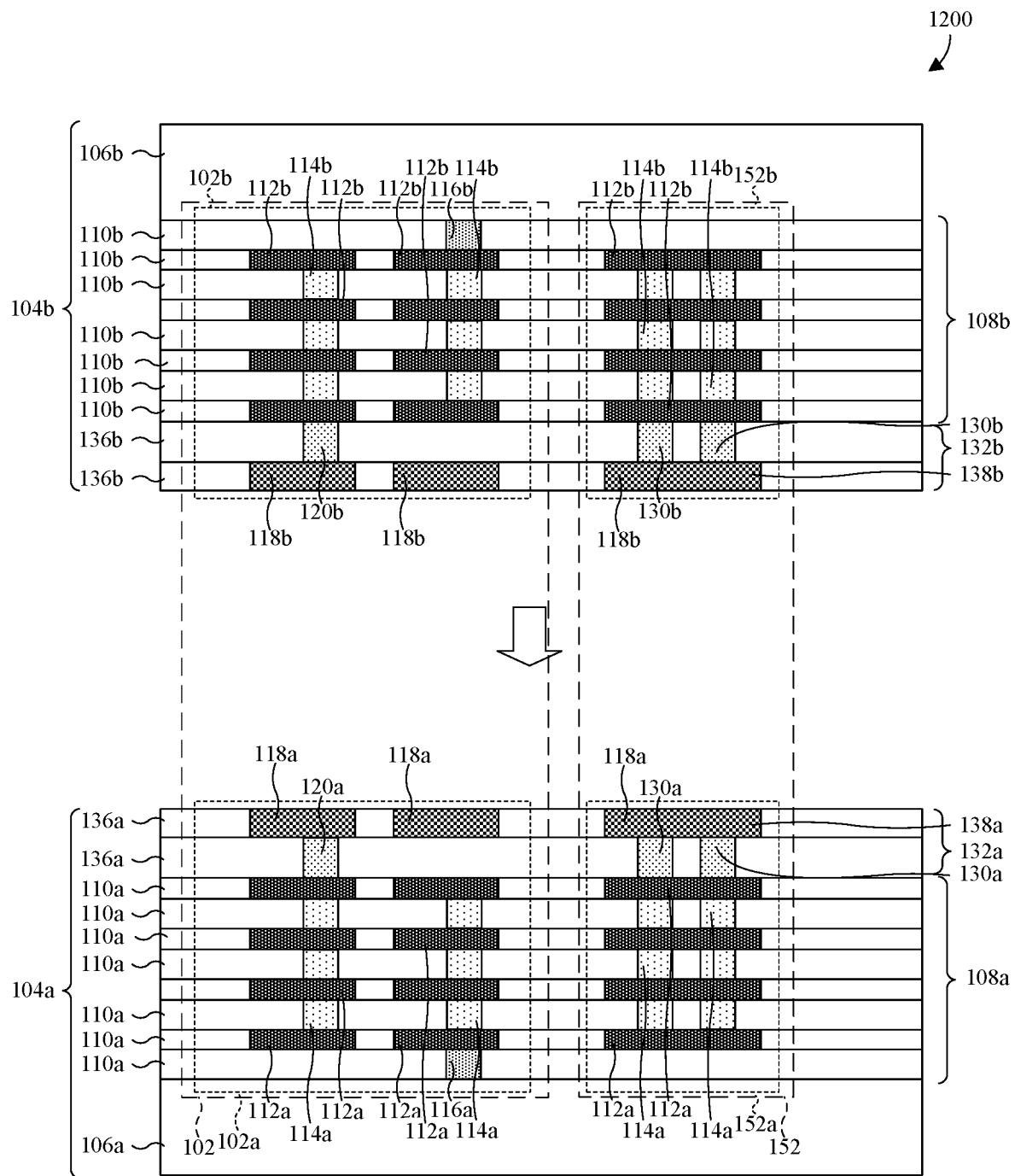

As illustrated by the cross-sectional view 1200 of FIG. 12, the second IC die 104b is flipped and bonded to the first IC die 104a, such that the first and second bonding structures 132a, 132b interface to define a hybrid bond (HB). The HB comprises a dielectric-to-dielectric bond between the first and second bonding dielectric layers 136a, 136b. Further, the HB comprises a conductor-to-conductor bond between the first and second redistribution layers 118a, 118b. Collectively, the first and second seal-ring substructures 102a, 102b define the seal-ring structure 102. Collectively, the first and second TSV coupling structures 152a, 152b define the TSV coupling structures 152. The process of bonding the second IC die 104b to the first IC die 104a may comprise, for example, fusion bonding processes and/or metallic bonding processes.

Figure 13:
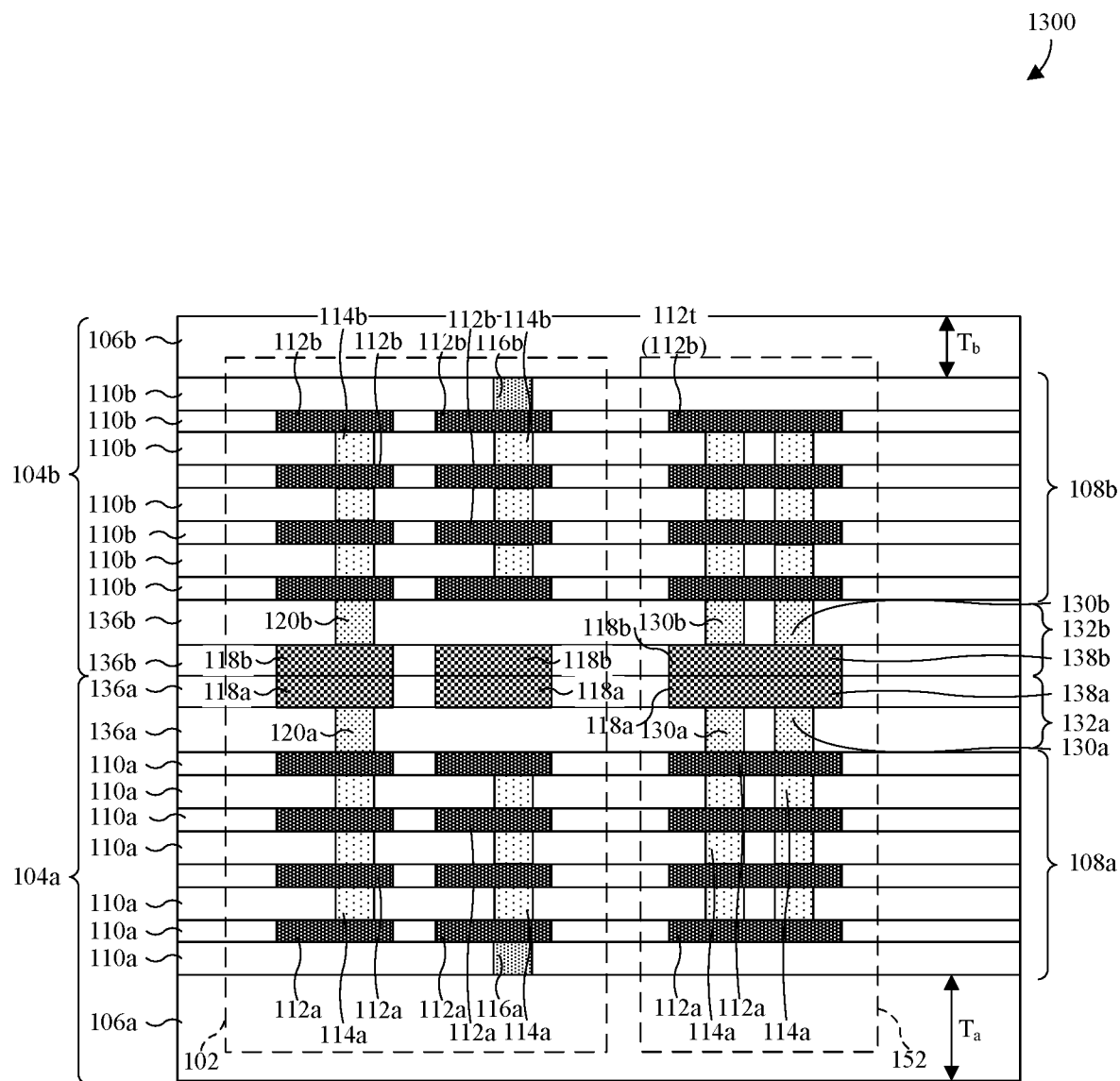

As illustrated by the cross-sectional view 1300 of FIG. 13, a planarization is performed on the second semiconductor substrate 106b to thin the second semiconductor substrate 106b to a thickness $T_b$. The planarization may be performed by, for example, a CMP and/or an etch back.

As illustrated by the cross-sectional view 1400 of FIG. 14, a series of selective etches is performed into the second semiconductor substrate 106b to form a backside semiconductor opening 1402 and a backside contact opening 1404 directly over the TSV coupling structures 152. The backside semiconductor opening 1402 and the backside contact opening 1404 are formed extending to a metal layer 122*t* of the second wiring layer 112*b* nearest the second semiconductor substrate 106*b*, thereby exposing the second wiring layer 112*b*. The backside contact opening 1404 has a width that is less than that of the backside semiconductor opening 1402. The selective etch may be performed selectively by, for example, photolithography. Then, a TSV 126 is formed filling the TSV opening 1302. The TSV 126 is conductive and may be formed of, for example, aluminum, copper, aluminum copper, some other conductive material, a combination of the foregoing, or the like. In some embodiments, the process for forming the TSV 126 comprises forming a conductive layer filling the TSV opening 1302 and covering the second semiconductor substrate 106*b*. The conductive layer may, for example, be formed by vapor deposition, atomic layer deposition, electrochemical planting, some other growth or deposition process, or a combination of the foregoing. Thereafter, a planarization is performed into the conductive layer to coplanarize an upper or top surface of the conductive layer with an upper or top surface of the second semiconductor substrate 106*b*, thereby forming the TSV 126. The planarization may be performed by, for example, CMP.

As illustrated by the cross-sectional view 1500 of FIG. 15, a passivation layer 148 is formed covering the second semiconductor substrate 106*b* and the TSV 126, and a pad structure 158 is formed through the passivation layer 148 reaching the TSV 126. The passivation layer 148 may, for example, be formed by vapor deposition (e.g., chemical or physical vapor deposition), atomic layer deposition, thermal oxidation, some other growth or deposition process, or a combination of the foregoing. Further, the passivation layer 148 may be formed of, for example, silicon dioxide, silicon nitride, some other dielectric, a combination of the foregoing, or the like. The passivation layer 148 may comprise a first passivation sub-layer 148*a* and a second passivation sub-layer 148*b* over the first passivation sub-layer 148*a*. The pad structure 158 is formed through the first and second passivation sub-layers 148*a*, 148*b*. The pad structure 158 comprises a first pad structure 158*a* extending through the first passivation sub-layer 148*a* to the TSV 126 and a second pad structure 158*b* extending through the second passivation sub-layer 148*b* to the first pad structure 158*a*. A planarization (e.g., a CMP) may be performed into the pad structure 158 to coplanarize an upper or top surface of the pad structure 158 with an upper or top surface of the second passivation sub-layer 148*b*.

As illustrated by the cross-sectional view 1600 of FIG. 16, a polymer layer 156 is formed covering the passivation layer 148 and the pad structure 158. A solder bump 140 is formed overlying the polymer layer 156 to provide electrical connections. The solder bump 140 may be made of metal material such as gold.

Figure 17:
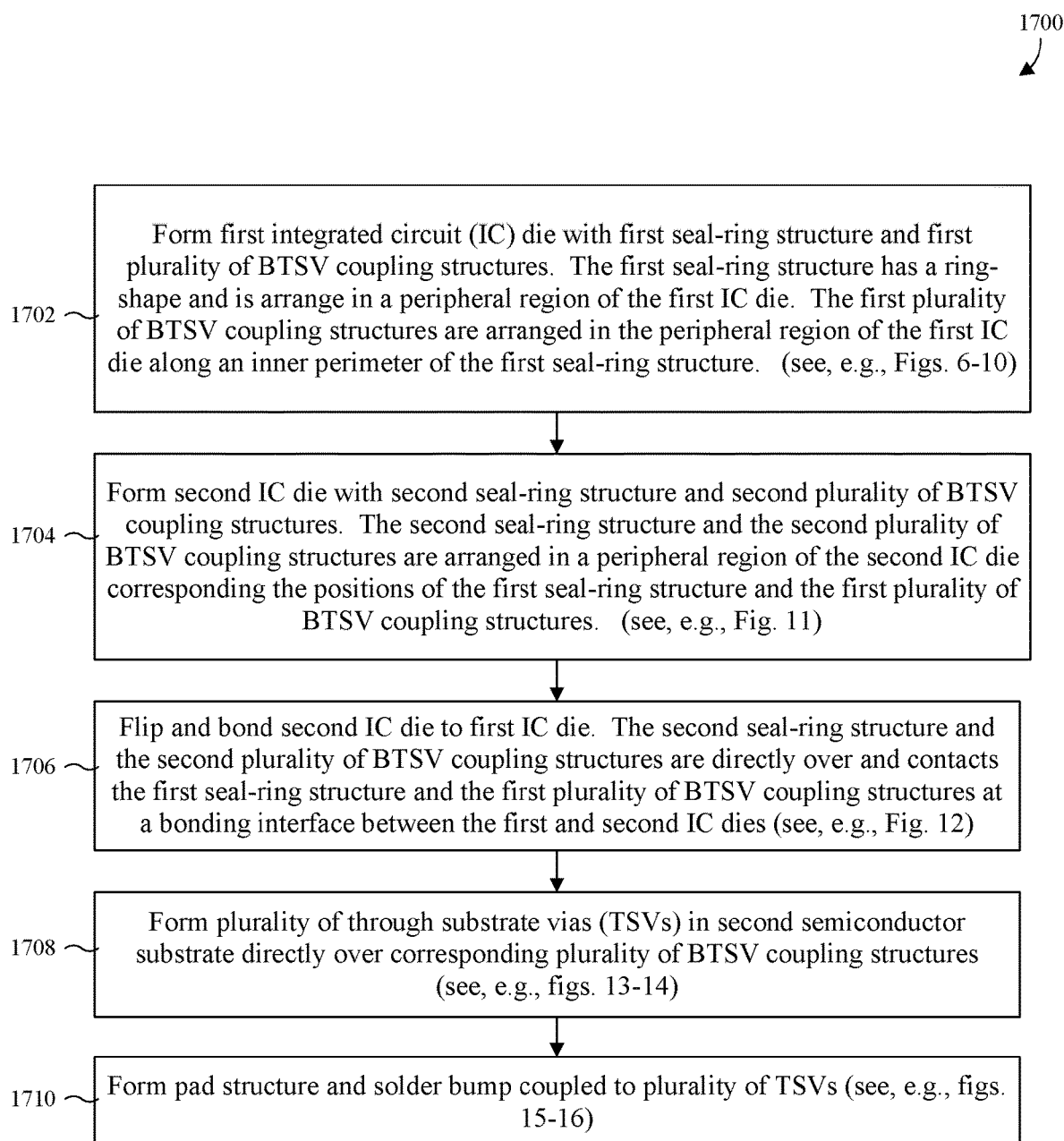
FIG. 17 illustrates a flowchart of some embodiments of the method of FIGS. 6-16.

With reference to FIG. 17, a flowchart 1700 of some embodiments of the method of FIGS. 6-16 is provided.

At 1702, a first IC die with a lower seal-ring structure and a plurality of lower TSV coupling structures is formed. The lower seal-ring structure has a ring-shape and is arranged in a peripheral region of the first IC die. The plurality of lower TSV coupling structures is arranged in the peripheral region of the first IC die along an inner perimeter of the lower seal-ring structure. See, for example, FIGS. 6-10.

At 1704, a second IC die with an upper seal-ring structure and a plurality of upper TSV coupling structures are formed. The upper seal-ring structure has a ring-shape and is arranged in a peripheral region of the second IC die. The plurality of upper TSV coupling structures is arranged in the peripheral region of the second IC die along an inner perimeter of the upper seal-ring structure. The positions of the upper seal-ring structure and the plurality of upper TSV coupling structures correspond to positions of the lower seal-ring structure and the plurality of lower TSV coupling structures. See, for example, FIG. 11.

At 1706, the second IC die is flipped and bonded to the first IC die, such that the upper seal-ring structure and the plurality of upper TSV coupling structures are directly over and contacts the lower seal-ring structure and the plurality of lower TSV coupling structures at a bonding interface between the first and second bonding structures. See, for example, FIG. 12.

At 1708, a plurality of through substrate vias (TSVs) is formed in the second semiconductor substrate directly over the corresponding plurality of TSV coupling structures. See, for example, FIG. 14. In some embodiments, forming the TSVs is preceded by thinning the second semiconductor substrate. The thinning may be performed by, for example, a planarization, such as CMP. See, for example, FIG. 13.

At 1710, a pad structure and a solder bump are formed directly over the plurality of TSV. See, for example, FIGS. 15-16.

While the flowchart 1700 of FIG. 17 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a 3D IC. A first IC die comprises a first bonding structure and a first interconnect structure over a first semiconductor substrate. A second IC die is disposed over the first IC die and comprises a second bonding structure and a second interconnect structure over a second semiconductor substrate. A seal-ring structure is in the first and second IC dies and extends from the first semiconductor substrate to the second semiconductor substrate. A plurality of through silicon via (TSV) coupling structures is arranged in the peripheral region of the 3D IC along an inner perimeter of the seal-ring structure and closer to the 3D IC than the seal-ring structure. The plurality of TSV coupling structures respectively comprises a TSV disposed in the second semiconductor substrate and electrically coupling to the 3D IC through a stack of TSV wiring layers and inter-wire vias.

Further, other embodiments of the present application provide a 3D IC. The 3D IC comprises a first IC die and a second IC die over the first IC die. The first IC die and the second IC die comprise respective semiconductor substrates, respective interconnect structures between the semiconductor substrates and respective bonding structures between the interconnect structures. A seal-ring structure is arranged at a peripheral region of the 3D IC in the first IC die and the second IC die. The seal-ring structure defines a barrier around an interior of the first and second IC dies. A plurality of through silicon via (TSV) coupling structures is arranged at the peripheral region of the 3D IC along an inner perimeter of the seal-ring structure. The plurality of through silicon via (TSV) coupling structures are discrete portions along the inner perimeter of the seal-ring structure.

Further yet, other embodiments of the present application provide another 3D IC. The 3D IC comprises a first IC die with a lower seal-ring structure and a plurality of lower TSV coupling structures arranged in a peripheral region of the first IC die. A second IC die has an upper seal-ring structure and a plurality of upper TSV coupling structures respectively connecting to the lower seal-ring structure and the plurality of lower TSV coupling structures. The second IC die is bonded to the first IC die, and the upper seal-ring structure contacts the lower seal-ring structure at a bonding interface between the first IC die and the second IC die to define a seal-ring structure. The plurality of upper TSV coupling structures contacts the plurality of lower TSV coupling structures at the bonding interface to define a plurality of TSV coupling structures. The plurality of lower TSV coupling structures are discretely arranged along an inner perimeter of the lower seal-ring structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional (3D) integrated circuit (IC) comprising:
   a first IC die comprising a first semiconductor substrate, a first interconnect structure over the first semiconductor substrate, and a first bonding structure over the first interconnect structure;
   a second IC die over the first IC die, wherein the second IC die comprises a second semiconductor substrate, a second bonding structure, and a second interconnect structure between the second semiconductor substrate and the second bonding structure, and wherein the second bonding structure contacts the first bonding structure at a bonding interface;
   a seal-ring structure arranged in a peripheral region of the 3D IC in the first IC die and the second IC die, wherein the seal-ring structure extends from the first semiconductor substrate to the second semiconductor substrate; and
   a plurality of through silicon via (TSV) coupling structures arranged at the peripheral region of the 3D IC along an inner perimeter of the seal-ring structure closer to the 3D IC than the seal-ring structure, wherein the plurality of TSV coupling structures respectively comprises a through silicon via (TSV) disposed in the second semiconductor substrate and electrically coupling to the 3D IC through a stack of TSV wiring layers and inter-wire vias.

2. The 3D IC according to claim 1, wherein the plurality of TSV coupling structures respectively defines a conductive path through a bonding contact respectively from the first interconnect structure to the second interconnect structure.

3. The 3D IC according to claim 1,
   wherein the first interconnect structure comprises a first interlayer dielectric (ILD) layer, first wiring layers, and first via layers, wherein the first wiring layers and the first via layers are alternatingly stacked in the first ILD layer; and
   wherein the second interconnect structure comprises a second ILD layer, second wiring layers, and second via layers, wherein the second wiring layers and the second via layers are alternatingly stacked in the second ILD layer.

4. The 3D IC according to claim 3,
   wherein the first bonding structure comprises a first bonding dielectric layer, a first redistribution layer and a first bonding contact extending from the first redistribution layer to the first interconnect structure;
   wherein the second bonding structure comprises a second bonding dielectric layer, a second redistribution layer and a second bonding contact extending from the second redistribution layer to the second interconnect structure; and
   wherein the first and second bonding dielectric layers contact each other at the bonding interface to define a dielectric-to-dielectric interface, wherein the first and second redistribution layers contact each other at the bonding interface to define a conductor-to-conductor interface.

5. The 3D IC according to claim 4,
   wherein the seal-ring structure comprises a first conductive ring and a second conductive ring disposed along an inner perimeter of the first conductive ring and spaced apart from the first conductive ring by the first and second ILD layers and the first and second bonding dielectric layers;
   wherein the first conductive ring comprises a first stack of the first interconnect structure and the second interconnect structure connected by the first and second redistribution layers and the first and second bonding contacts, wherein the first conductive ring is electrically isolated from the first and second semiconductor substrates; and
   wherein the second conductive ring comprises a second stack of the first interconnect structure and the second interconnect structure connected respectively to first and second device contacts, wherein the first interconnect structure and the second interconnect structure of the second stack is electrically isolated from one another by the first and second bonding dielectric layers.

6. The 3D IC according to claim 1, wherein the plurality of TSV coupling structures respectively comprises a third stack of the first interconnect structure and the second interconnect structure connected by a TSV redistribution layer and a TSV bonding contact, wherein the plurality of TSV coupling structures is electrically coupled to devices of the 3D IC.

7. The 3D IC according to claim 1, further comprising:
   a passivation layer covering the first and second IC dies; and
   a plurality of pad structures directly over the plurality of TSV coupling structures, wherein the plurality of pad structures extends through the passivation layer to the second semiconductor substrate.

8. The 3D IC according to claim 7,
   wherein the TSV connects the pad structures to the second interconnect structure, wherein sidewalls of the TSV are continuous from the pad structures to the second interconnect structure.

9. The 3D IC according to claim 1, wherein the plurality of TSV coupling structures are discrete portions along the inner perimeter of the seal-ring structure and separated from one another by a dielectric material.

10. The 3D IC according to claim 1, further comprising:
a three-dimensional (3D) IC circuitry arranged in the first and second IC dies, wherein the seal-ring structure encloses the 3D IC circuitry so as to protect the 3D IC circuitry, and the plurality of TSV coupling structures laterally encompass the 3D IC circuitry and electrically coupled to the 3D IC circuitry.

11. A three-dimensional (3D) integrated circuit (IC) comprising:
a first IC die and a second IC die over the first IC die, wherein the first IC die and the second IC die comprise respective semiconductor substrates, respective interconnect structures between the semiconductor substrates, and respective bonding structures between the interconnect structures;
a seal-ring structure arranged at a peripheral region of the 3D IC in the first IC die and the second IC die, wherein the seal-ring structure defines a barrier around an interior of the first and second IC dies; and
a plurality of through silicon via (TSV) coupling structures arranged at the peripheral region of the 3D IC along an inner perimeter of the seal-ring structure;
wherein the plurality of through silicon via (TSV) coupling structures are laterally discrete portions along the inner perimeter of the seal-ring structure.

12. The 3D IC according to claim 11, wherein the seal-ring structure comprises a first conductive ring having a bonding contact and a redistribution layer electrically coupled to the interconnect structures, and wherein the seal-ring structure further comprises a second conductive ring without bonding contacts or redistribution layers.

13. A three-dimensional (3D) integrated circuit (IC), comprising:
a first IC die with a lower seal-ring structure and a plurality of lower TSV coupling structures arranged in a peripheral region of the first IC die;
a second IC die with an upper seal-ring structure and a plurality of upper TSV coupling structures respectively connecting to the lower seal-ring structure and the plurality of lower TSV coupling structures; and
wherein the second IC die is bonded to the first IC die, and wherein the upper seal-ring structure contacts the lower seal-ring structure at a bonding interface between the first IC die and the second IC die to define a seal-ring structure, and the plurality of upper TSV coupling structures contacts the plurality of lower TSV coupling structures at the bonding interface to define a plurality of TSV coupling structures; and
wherein the plurality of lower TSV coupling structures are discretely arranged along an inner perimeter of the lower seal-ring structure.

14. The 3D IC according to claim 13, wherein the first IC die comprises a first interconnect structure comprising an alternating stack of via layers and wiring layers, a first bonding contact contacting a top one of the wiring layers, a first TSV bonding contact disposed over the first interconnect structure, and a first redistribution layer contacting the first bonding contact.

15. The 3D IC according to claim 14, wherein the lower seal-ring structure comprises a first lower conductive ring and a second lower conductive ring, wherein the first bonding contact and the first redistribution layer are respectively disposed within the first lower conductive ring, and wherein the first bonding contact is absent from the second lower conductive ring.

16. The 3D IC according to claim 15, wherein the first lower conductive ring and the second lower conductive ring are concentric to one another.

17. The 3D IC according to claim 13, wherein the plurality of TSV coupling structures respectively defines a conductive path from a first semiconductor substrate of the first IC die to a second semiconductor substrate of the second IC die.

18. The 3D IC according to claim 17, further comprising:
a passivation layer covering the first and second IC dies; and
a plurality of pad structures within the passivation layer and directly over the plurality of TSV coupling structures, wherein the pad structures contact the second semiconductor substrate.

19. The 3D IC according to claim 18, further comprising a plurality of through silicon vias (TSVs) disposed through the second semiconductor substrate and reach on the plurality of TSV coupling structures, the TSVs having an upper surface even with an upper surface of the second semiconductor substrate.

20. The 3D IC according to claim 19, wherein the plurality of pad structures extends through the passivation layer to reach on the TSVs.

* * * * *